United States Patent [19]

Bruce et al.

[11] Patent Number: 5,614,990
[45] Date of Patent: Mar. 25, 1997

[54] ILLUMINATION TAILORING SYSTEM USING PHOTOCHROMIC FILTER

[75] Inventors: James A. Bruce, Williston; Joseph Gortych, Essex Junction; Michael S. Hibbs, Westford, all of Vt.

[73] Assignee: International Business Machines Corporation, Armonk, N.Y.

[21] Appl. No.: 298,643

[22] Filed: Aug. 31, 1994

[51] Int. Cl.[6] .................................................. G03B 27/42
[52] U.S. Cl. ................................. 355/71; 355/53; 355/67
[58] Field of Search .................................. 355/53, 67, 68, 355/69, 70, 71

[56] References Cited

U.S. PATENT DOCUMENTS

| | | | |
|---|---|---|---|
| 3,970,382 | 7/1976 | Fisher et al. | 355/4 |
| 4,447,128 | 5/1984 | Ferrer | 350/174 |
| 4,570,252 | 2/1986 | Drexler | 369/109 |
| 4,831,452 | 5/1989 | Takanashi et al. | 358/213.14 |
| 4,875,076 | 10/1989 | Torigoe et al. | 355/53 |
| 5,055,871 | 10/1991 | Pasch | 355/53 |
| 5,137,363 | 8/1992 | Kosugi et al. | 356/40 |
| 5,162,642 | 11/1992 | Okamotsu et al. | 250/201.6 |
| 5,274,420 | 12/1993 | Chastang et al. | 355/67 |

FOREIGN PATENT DOCUMENTS 2-5405    10/1990    Japan.
2-208919  12/1990    Japan.

OTHER PUBLICATIONS

Rabek, J. F., et al, "Coordination Complexes Between Iron (III) Chloride and Polyether, Polyester, and Poly(ether ester), Marcomolecules," vol. 24, No. 4, pp. 836–841, 1991.
Noguchi, et al., "Subhalf Micron Lithography System with Phase–Shifting Effect", Cannon, Inc., 14 pages.

*Primary Examiner*—M. L. Gellner
*Assistant Examiner*—Daniel P. Malley
*Attorney, Agent, or Firm*—Heslin & Rothenberg, P.C.; Wayne F. Reinke, Esq.

[57] ABSTRACT

Photochromic glass is situated between a light source for exposing resist coated on a wafer and the wafer. The photochromic glass is activated by a wavelength different from that which activates the resist. An array of individual light sources, each of varying intensity, provide activation light to the photochromic glass. A CCD array temporarily in the imaging plane measures light intensity distribution. A controller varies the individual light source array intensities to activate the photochromic glass to varying degrees to produce a desired effect at the imaging plane.

31 Claims, 5 Drawing Sheets

ILLUMINATION TAILORING SYSTEM USING PHOTOCHROMIC FILTER

BACKGROUND OF THE INVENTION

1. Technical Field

The present invention generally relates to imaging systems. More particularly, the present invention relates to imaging systems utilizing photolithographic techniques.

2. Background Art

Optical projection systems are used in many scientific and industrial applications, an example of the latter being the manufacture of microcircuits on a semiconductor substrate or wafer, the process being referred to as "photolithography". In lithography, mask patterns, typically opaque chrome on glass, are imaged onto a semiconductor wafer coated with a light-sensitive material often referred to as "photoresist" or "resist". The wafer is then subjected to several processing steps, including developing the photoresist and etching the wafer to create various circuit structures. To achieve successful microcircuit performance, the imaging system must faithfully reproduce the mask pattern in the photoresist. Due to ever-decreasing size constraints, many of these imaging systems are often operated near or at their resolution limit. Even with a projection system that is optically perfect, variations in the size and shape of the imaged features may still occur, due to, for example, nonuniform mask illumination or optical aberrations, such as field curvature, coma, astigmatism and spherical aberration. These occurrences are capable of significantly altering the image of the object (i.e., feature size or line width) over the imaging plane. It is also possible with a perfect optical system having no aberrations and uniform mask illumination to have variations in the size of a particular feature over the image plane, for example, if the light illuminating the mask is not properly directed into the projection lens pupil. Thus, a problem of nonuniform imaging exists.

In the past, photochromic glass has been interposed at specific locations between the light source and the mask to achieve uniform mask illumination. This is said to be achieved by the self-uniformizing action of the photochromic glass. However, the resist exposure wavelength (also referred to as the "actinic wavelength") is the same as that activating the photochromic glass. This results in an overall diminution in the beam intensity exposing the light-sensitive material of up to 50%, seriously diminishing the ability of the system to expose wafers in a timely manner. The throughput of a photolithographic system is a major driver of the overall cost per chip. Another disadvantage is that the nature of the photochromic glass self-uniformizing action precludes tailoring the beam intensity to achieve a desired end result at the wafer plane. What ultimately determines the uniformity of lithographic imaging is the uniformity of exposure at the imaging plane and not necessarily the uniformity of the illumination across the mask.

An illumination system with the flexibility to irradiate the mask in a way that creates a desired result at the imaging plane, for example, uniform imaging of a given feature over the entire wafer, would have many advantages over an illumination system only providing uniform illumination of the mask.

Thus, a need exists for an improved way to expose light-sensitive material, in particular, an improved way to expose resist on semiconductor wafers, without increasing the exposure time.

SUMMARY OF THE INVENTION

Briefly, the present invention satisfies the need for an improved way to expose light-sensitive material without increasing exposure time by utilizing a photochromic filter which is activated by light of a wavelength different from that which activates the light-sensitive material.

In accordance with the above, it is an object of the present invention to provide an improved way to expose light-sensitive material.

It is another object of the present invention to provide a way to expose light-sensitive material with light of one wavelength passed through a photochromic filter activated by light of a another wavelength.

It is a further object of the present invention to provide method and apparatus for consistent imaging of integrated circuit features.

It is still another object of the present invention to provide method and apparatus for tailoring the exposure intensity for integrated circuit features.

The present invention provides, in a first aspect, apparatus for exposing a light-sensitive material situated in an imaging plane. The apparatus comprises a photochromic filter activated by light of a first wavelength, a first light source for activating the photochromic filter with light of the first wavelength and a second light source for exposing the light-sensitive material with light of a second wavelength different from the first wavelength passed through the photochromic filter. The first light source may comprise a variable intensity light source. The apparatus may further comprise a detector situated in the imaging plane for measuring light intensity, and a controller for controlling the variable intensity light source based on the measured light intensity.

The present invention provides, in a second aspect, a method for exposing a light-sensitive material in an imaging plane. The method comprises a first step of activating a photochromic filter with light of a first wavelength. The photochromic filter is situated in a light path for exposing the light-sensitive material. The method comprises a second step of exposing the light-sensitive material with light of a second wavelength passed through the activated photochromic filter. The step of activating may comprise exposing the photochromic filter to varying intensity light of the first wavelength. The method may further comprise measuring light intensity at the imaging plane, and altering intensity of the light of the first wavelength based on the measured light intensity.

The present invention provides several advantages over existing imaging systems. One advantage is that the exposure can be tailored across the imaging plane. Another advantage is that tolerances on the system elements may be looser, thus allowing less expensive components to be used. Generally, much effort goes into placing and coating lenses and mirrors in imaging systems to provide uniform illumination. The "feedback" provided in the present invention effectively compensates for imperfections in system components.

These, and other objects, features and advantages of this invention will become apparent from the following detailed description of the various aspects of the invention taken in conjunction with the accompanying drawings.

BEST MODE FOR CARRYING OUT THE INVENTION

Figure 1:
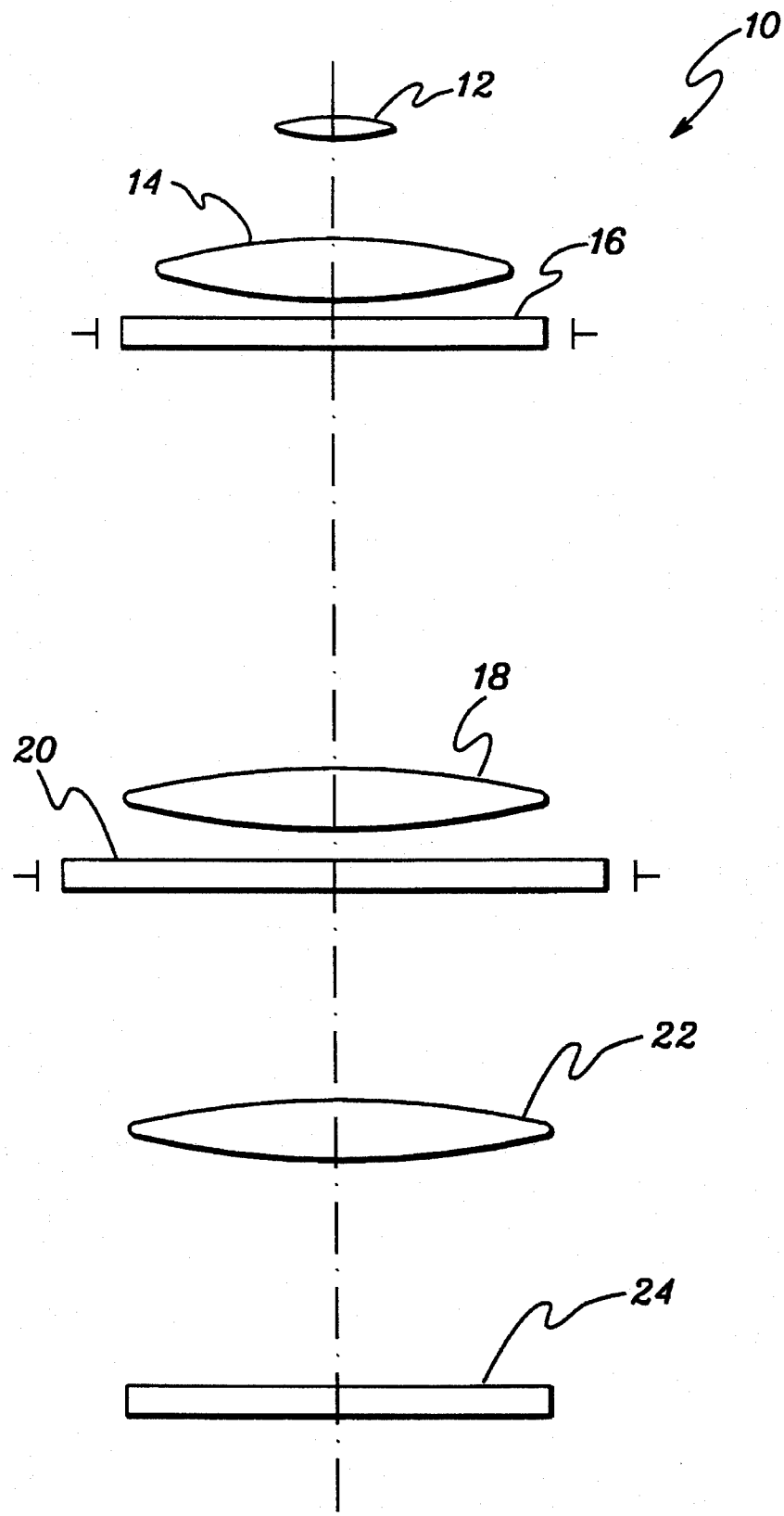
FIG. 1 is a block diagram for a prior art lithographic system utilizing photochromic glass.

FIG. 1 depicts a prior art lithographic system 10 for imaging integrated circuit features in a light-sensitive material coated onto a semiconductor wafer. Lithographic system 10 includes light source 12, lens 14, photochromic glass 16, lens 18, mask 20, lens 22 and semiconductor wafer 24. Photochromic glass 16 can be one of several types; one basic type turns darker upon exposure to a particular wavelength light, and another basic type turns clearer upon exposure to a particular wavelength light. There are other more complex types of photochromic materials but for the purposes of discussion assume that photochromic glass 16 is of the type that turns darker upon exposure to a particular wavelength light. Photochromic glass 16 provides a self-uniformizing action; that is, the glass turns darker in areas where the incident light is more intense (brighter). The darker the glass becomes, the more attenuated (i.e., dimmer or less intense) the light entering the glass will become, and therefore the light leaving the photochromic glass will be of relatively uniform intensity. The theory behind the operation of lithographic system 10 is that providing the mask with a uniform intensity beam of light will result in a uniformly exposed wafer, reducing or eliminating undesired feature differences, for example, differences in line width across wafer 24. Unfortunately, this theory may not operate accordingly in practice.

Light source 12 provides the light that activates the light-sensitive material coated on wafer 24. The light sensitive material, referred to as photoresist, is one of two types; a first type becomes solvent-resistant upon exposure to a particular wavelength light (referred to as the "actinic" wavelength), and a second type becomes solvent-sensitive upon exposure to an actinic wavelength light. Light exiting source 12 is focused by lens 14 into photochromic glass 16. Photochromic glass 16 self uniformizes the light entering it and provides light of relatively uniform intensity to lens 18 for focusing through mask 20. As one skilled in the art will know, mask 20 provides a light-blocking pattern for the creation of features in the resist of wafer 24. The light pattern exits mask 20, is focused by lens 22 and exposes the photoresist on wafer 24 to create features therein. Wafer 24 is said to be in the "imaging plane" of system 10, discussed more fully subsequently.

For a number of reasons, lithographic system 10 often fails to produce uniform features. For example, if the light entering lens 18 is not properly directed, the light entering mask 20 will not be properly directed, affecting the light going through lens 22, and therefore causing improper exposure of the resist on wafer 24. As another example, aberrations in lenses 18 and/or 20 may cause light intensity variations, regardless of how uniform the intensity of the light is that exits photochromic glass 16. As a further example, some imaging systems scan over the wafer, inherently at different speeds at different locations, thus providing nonuniform exposure time across the wafer plane. Under those circumstances, even if the light arriving at the wafer is of uniform intensity, exposure will vary. In addition, there are situations where only partial illumination of the wafer plane is desired, blocking other portions. Thus, uniform illumination of the wafer is not always the ultimate goal. Another shortcoming of lithographic system 10 is that the exposure time needed to create the features in the resist coated on wafer 24 is greatly increased, due to the fact that the activating wavelength of photochromic glass 16 is the same as the actinic wavelength for exposing the resist coated on wafer 24. In general, light of the activating wavelength for a particular photochromic glass is greatly attenuated, due to absorption, within the photochromic glass. Thus, the use of resist-exposure light of an actinic wavelength equal to the photochromic glass activating wavelength is undesirable, since the number of wafers producible per unit time is decreased.

Figure 2:
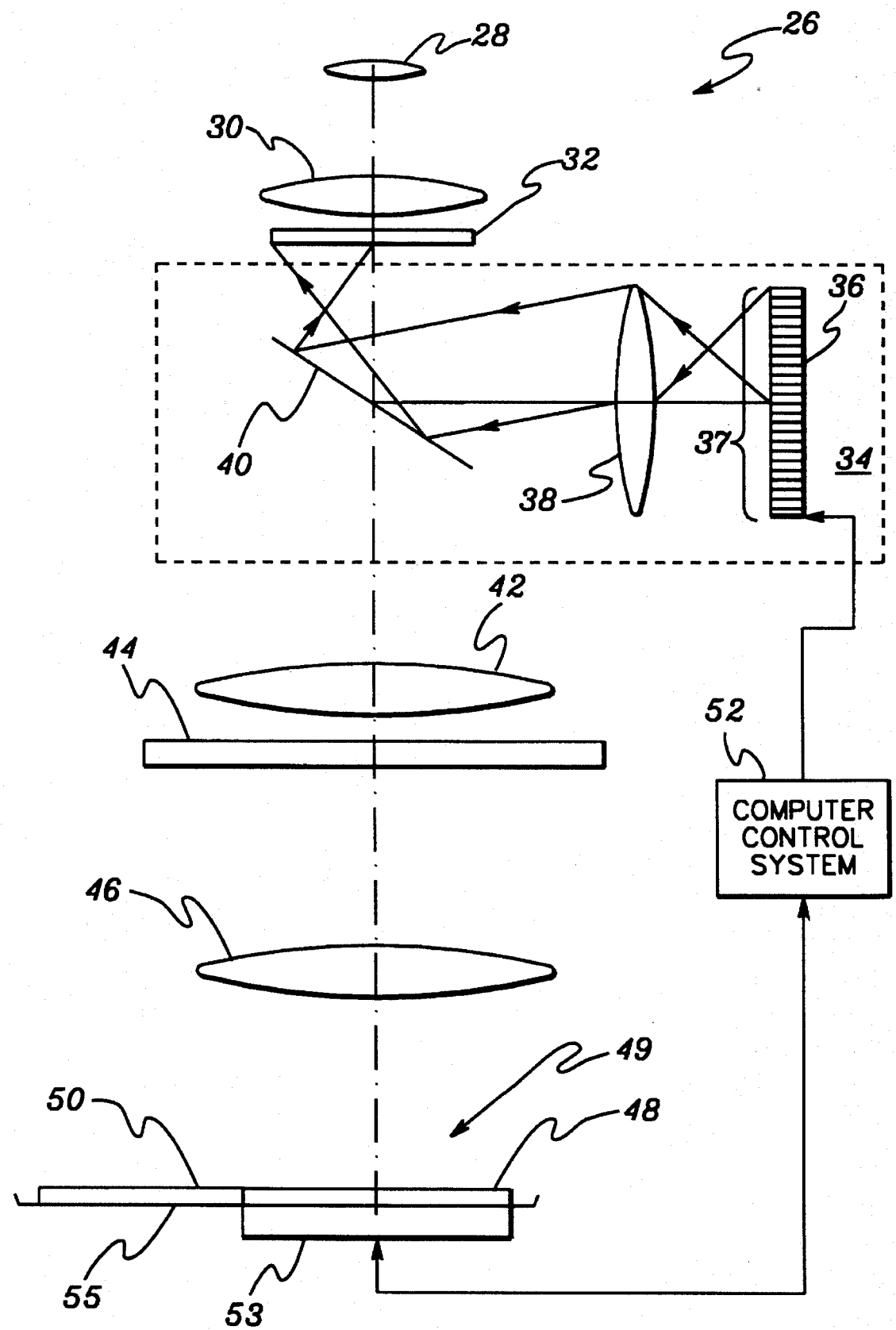
FIG. 2 is a block diagram for a lithographic system according to the present invention.

FIG. 2 depicts a lithographic system 26 according to the present invention. Lithographic system 26 includes wafer light source 28, lens 30, photochromic filter 32, photochromic filter activation system 34, including light source array 36, lens 38 and beam splitter 40, lens 42, mask 44, lens 46, wafer stage 55 on which reside semiconductor wafer 48 and CCD array 50, wafer stage slider 53 and computer control system 52.

The operation of lithographic system 26 will now be described in detail. Wafer light source 28 provides light at a first wavelength for activating resist coated on wafer 48. Photochromic filter 32 is activated by light of a second wavelength different from the wavelength that activates the resist on wafer 48. Activation of photochromic filter 32 is provided by photochromic filter activation system 34. The purpose of photochromic filter activation system 34 in the present embodiment is to selectively activate photochromic filter 32, without interfering with feature creation in the resist of wafer 48. The term "selectively activate" as used herein means that photochromic filter 32 is activated to varying degrees in different portions thereof with light of varying intensity over the plane of photochromic filter 32. However, it will be understood that photochromic filter 32 could be activated with a single intensity beam and still serve the purpose(s) of the present invention. As another example, a single source modulated with an addressable spatial light modulator may be used. As still a further example, a diffuser could be placed over the array to vary the intensity.

System 34 achieves selective activation through the use of light source array 36, comprising a plurality of individual light sources 37, each with a variable intensity. Used in conjunction with lens 38 and beam splitter 40, variable intensity light sources 37 provide light of varying intensity across the plane of photochromic filter 32 for selective activation thereof. Beam splitter 40 is coated with a suitable multi-layer dielectric stack allowing reflection of the light from array 36 and transmittance of the light from wafer light source 28. One skilled in the art will be familiar with beam splitters. Alternatively, photochromic filter activation system 34 may be placed to activate filter 32 without intruding into the imaging path of light source 28. If placed outside of the imaging path, beam splitter 40 is not needed. As an alternative, photochromic filter activation system 34 could comprise, instead of array 36, a raster scanner that scans a light beam of variable intensity periodically across lens 38 or directly onto photochromic glass 32 if outside the imaging path. One skilled in the art will be familiar with such raster scanners.

A significant portion of the light activating photochromic filter 32 is absorbed thereby. However, light from wafer light source 28, focused through lens 30, enters and exits activated photochromic filter 32 with significantly less absorption and is relayed to mask 44 via lens 42. Light forming the mask pattern exits mask 44 and is focused onto wafer 48 via lens 46. Mask 44 is said to be "conjugate" to wafer 48, meaning that mask 44 is in a position such that its pattern is imaged onto wafer 48. In general, a conjugate plane is a plane that is imaged to another plane in the imaging system. Wafer 48 lies in the imaging plane 49 of system 26, which is simply an area of a predetermined distance from light source 28 providing a proper focus for the desired exposure of a given light-sensitive material, here, photoresist. Beside wafer 48 is CCD (charge coupled device) array 50 for measuring the intensity distribution of the light coming out of lens 46. Wafer 48 and CCD array 50 both reside on wafer stage 55. CCD array 50 may be moved into imaging plane 49 through the use of wafer stage slider 53, the details of which are not germane to the present invention. The function of wafer stage slider 53, to move wafer 48 and CCD array 50 into and out of imaging plane 49, may be accomplished in any number of ways, one example of which is a mechanism that slides wafer stage 55 to the left and right. Since the light coming from wafer light source 28 is of a different wavelength than that coming from light source array 36, a significantly smaller portion of the resist activation light will be attenuated by photochromic filter 32. CCD array 50 can be thought of as a grid with a plurality of tiny detectors, analogous to the pixels in a monitor screen. This "grid" allows one to map out the light intensity over a plane (in this case, imaging plane 49). The intensity measurements from CCD array 50 are provided to computer 52 so that the desired intensity distribution is achieved by altering the intensity of variable intensity light sources 37.

In general, resist exposure can be expressed as a product of time and light intensity. Resist exposure determines, for example, the line width of a feature sought to be created in the resist of wafer 48. Thus, if time is held constant, tailoring the light intensity across wafer 48 lying in imaging plane 49 will, for a given type of feature, provide uniform line width. The greater the exposure (the greater the intensity), the smaller a given line width will be for positive tone resist, and the greater the exposure, the larger a given line width will be for negative tone resist. Assume, for purposes of discussion, a positive tone resist is used herein. Thus, in areas of the imaging plane where the line width would be too large, as determined in practice or by CCD array 50, the exposure is increased by increasing the intensity of the light incident upon that area. Where the line width would be too small, the intensity of the light incident in that area is decreased.

The sampling for CCD array 50 will depend on the particular situation. The number of pixels in CCD array 50, the placement thereof and the sampling rate combine to provide intensity distribution information to computer control system 52. In general, the number of samples may be relatively small, since the intensity distribution over a given imaging plane in many lithography systems does not generally vary widely over the imaging plane. In addition, in some situations even a single detector may be used and scanned around the imaging plane for intensity distribution measurements to set the intensity of light source array 36. However, the preferred method is to dynamically change (i.e., periodically test) the intensities of light sources 37 to ensure uniform feature creation over time.

Figure 3:
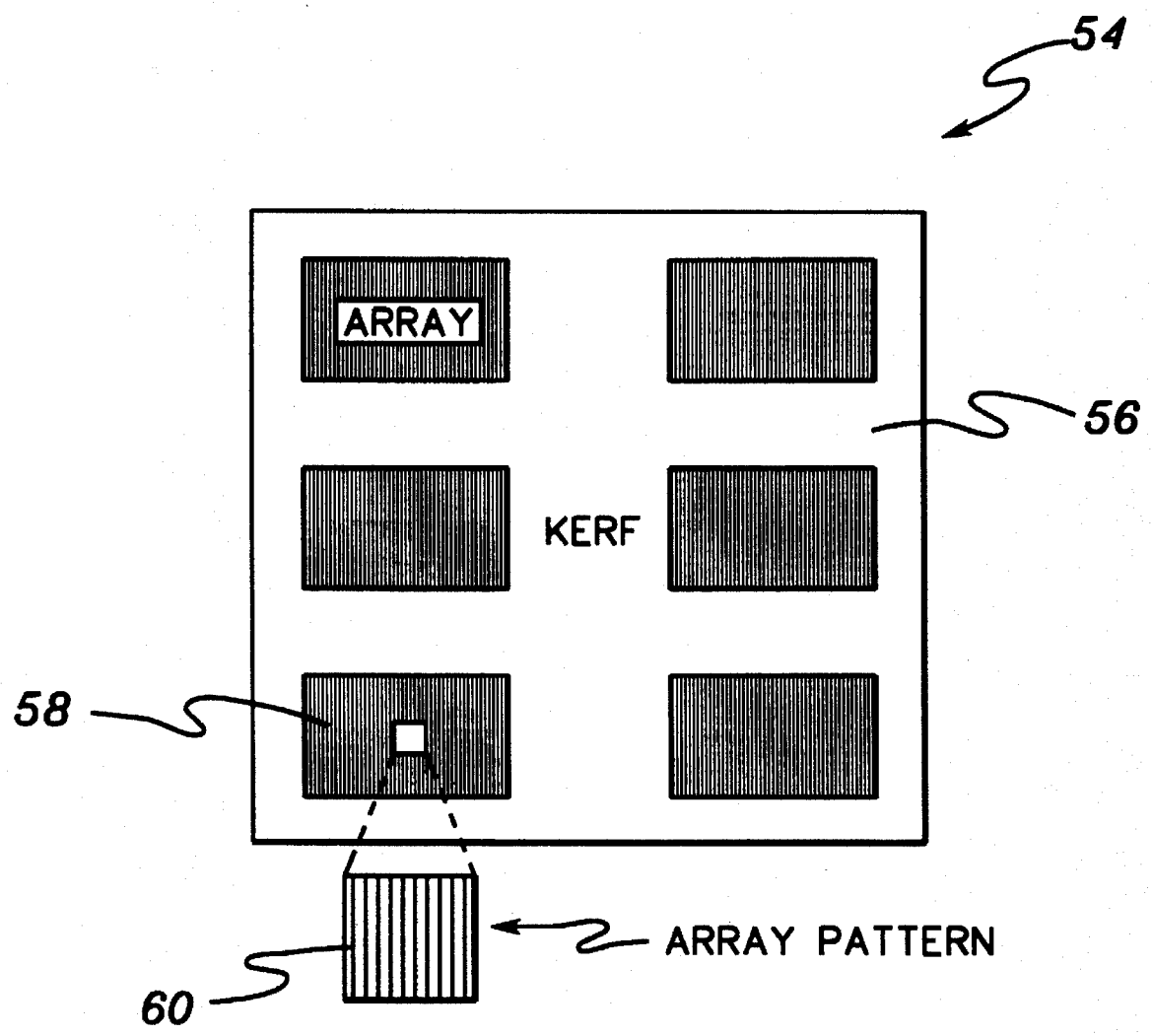
FIG. 3 depicts an imaging pattern on a semiconductor wafer produced by the lithographic system of FIG. 2.

In addition to providing uniform feature imaging, to within about 2–3% across imaging plane 49, lithographic system 26 may also be used to create a blocking pattern separate and apart from and/or used in conjunction with any pattern existing on mask 44. FIG. 3 depicts an image 54 produced on wafer 48 in lithographic system 26. Image 54 includes two types of regions; a kerf region 56, which is shown in image 54 as blank areas, and an array region (e.g., array region 58), which has a repetitive pattern 60 therein. Assume that the array regions have small, repeated features, and that the kerf region contains larger features used to, e.g., line up mask 44 with wafer 48. Thus, since the features in the two regions are of different sizes, it may be advantageous to expose the regions differently. If mask 44 contains the pattern for both types of regions, proper exposure of both pattern types could be achieved by covering one type of region up while the other is being exposed, and vice versa. The present invention could be used to activate photochromic filter 32 in such a way as to create a blocking pattern so that only those portions of the mask relevant to a particular region are illuminated.

In a second aspect of the present invention, a method for exposing light-sensitive material is provided. The method will now be described with reference to FIGS. 4 and 5 in conjunction with lithographic system 26 of FIG. 2.

Figure 4:
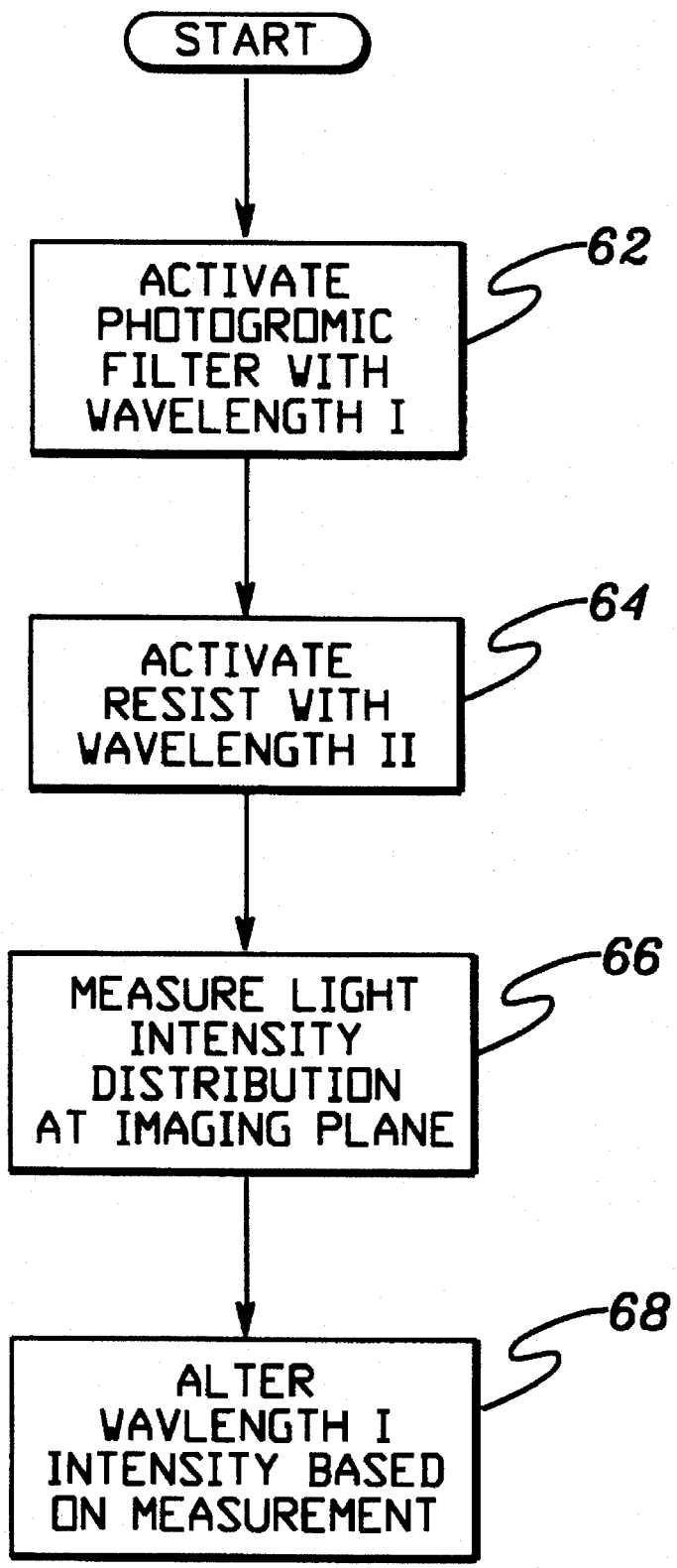
FIG. 4 is a flow diagram of a method for exposing light-sensitive material according to the present invention.

FIG. 4 is a flow diagram for the method of the second aspect of the present invention. In the method, photochromic filter conjugate to an imaging plane containing a light-sensitive material is activated with light of a first wavelength (STEP 64, "ACTIVATE PHOTOCHROMIC FILTER WITH WAVELENGTH I"). In system 26, photochromic glass 32 is activated by activation system 34 as described above. The light-sensitive material is activated with light of a wavelength different than the activation wavelength for the photochromic glass (STEP 64, "ACTIVATE RESIST WITH WAVELENGTH II"). In system 26, resist-coated wafer 48 is exposed via light from source 28 as described above. The light intensity at the imaging plane is measured to determine an intensity distribution thereat (STEP 66, "MEASURE LIGHT INTENSITY DISTRIBUTION AT IMAGING PLANE"). In system 26, STEP 66 is accomplished by CCD array 50 in conjunction with computer control 52. Finally, the intensity of the wavelength I light is altered based on the measured light intensity distribution (STEP 68, "ALTER WAVELENGTH I INTENSITY BASED ON MEASUREMENT"). In system 26, the intensity of individual light sources 37 is controlled by computer control system 52 based on the light intensity measurements taken by CCD array 50.

Figure 5:
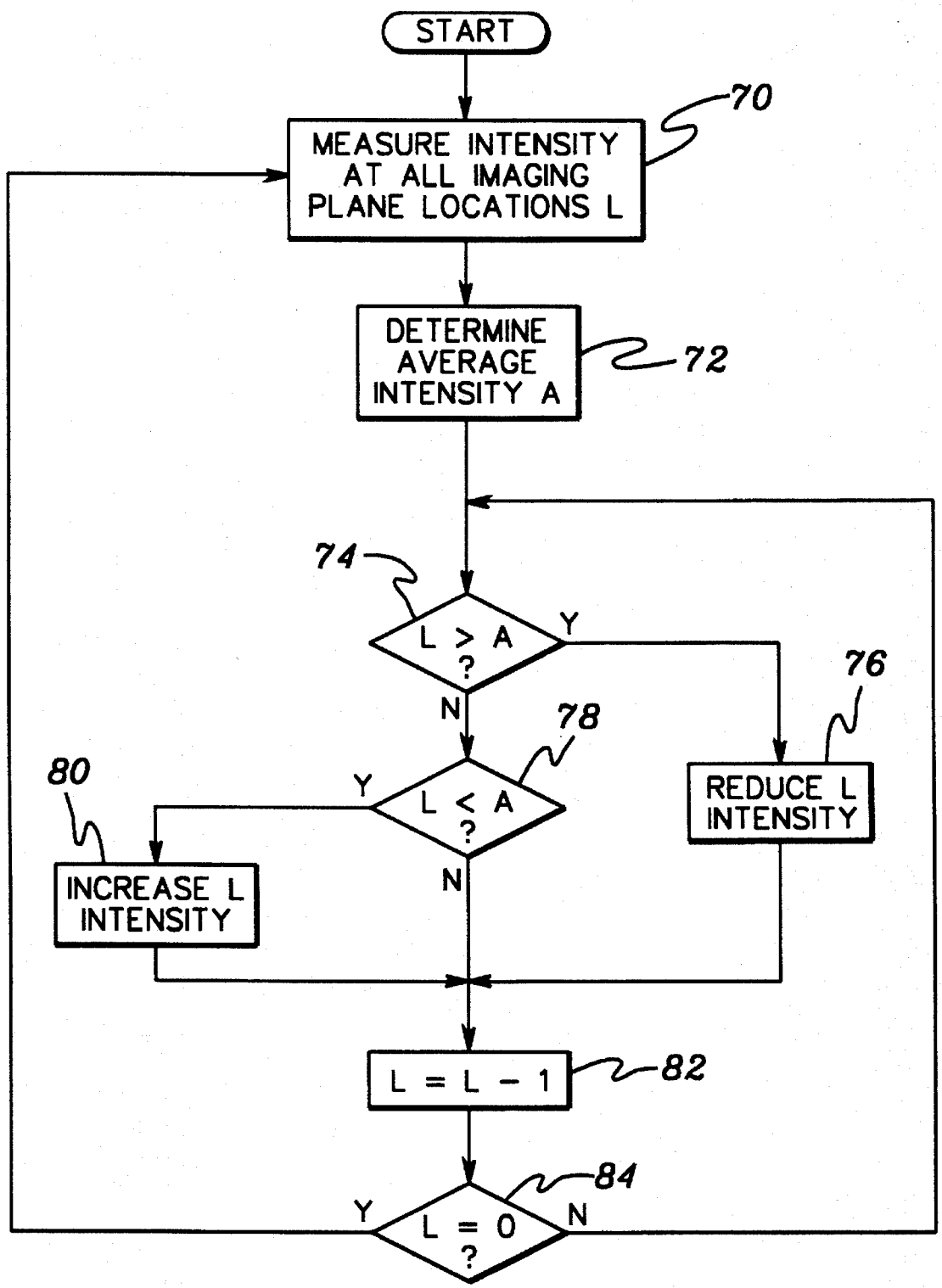
FIG. 5 is a more detailed flow diagram of a portion of the flow diagram of FIG. 4.

STEP 68, applied to system 26, is performed by CCD array 50 and light source array 36 under the control of computer 52. FIG. 5 is a flow diagram for the control provided by computer 52 in order to perform STEP 68. An intensity measurement for a plurality of locations at the imaging plane is first obtained (STEP 70, "MEASURE INTENSITY AT ALL IMAGING PLANE LOCATIONS L"). It should be noted that STEP 70 is actually part of STEP 66 in FIG. 4, however, STEP 70 is necessary for a complete description of the control for computer 52. As used in the context of FIG. 5, "L" is both a counter for the number of light intensity measurements and a value for a particular measurement. After the intensity for all locations is measured, an average intensity "A" is determined (STEP 72, "DETERMINE AVERAGE INTENSITY A"). An inquiry is then made as to whether the measured intensity for a given location is larger than the average intensity (INQUIRY 74, "L>A?"). If the intensity measured is larger than the average, then the intensity of the light incident upon that location is reduced (STEP 76, "REDUCE L INTENSITY"). With respect to system 26, this intensity reduction is achieved by increasing the intensity of an appropriate individual light source 37 to darken photochromic glass 32 in a region corresponding to location L on wafer 48. If the intensity measurement for location L is not larger than the average intensity, another inquiry is made as to whether the intensity measurement is less than the average (INQUIRY 78, "L<A?"). If the intensity measurement is less than the average intensity, the intensity of the light incident upon location L is increased (STEP 80, "INCREASE L INTENSITY"). In system 26, the light intensity at location L is increased in a manner similar to that for the reduction of intensity, except that the intensity of a corresponding individual source 37 is reduced. Regardless of whether the intensity measurement is greater than, less than or equal to the average intensity, the location measurement of interest is altered (STEP 82, "L=L−1"). An inquiry is then made as to whether all locations have been considered (INQUIRY 84, "L=0?"). If all locations have been considered, then the measurement intensity across the imaging plane may be repeated, i.e., return to STEP 70. If all locations have not been considered, then the method returns to STEP 74. It will be understood that the method of FIG. 5 can readily be implemented in software utilized by computer control system 52. As described, the method of FIG. 5 is dynamic in that the light intensity distribution across the imaging plane is continuously or periodically being measured. However, if one were to make one or a series of such measurements in order to set system 26, the method depicted in FIG. 5 would simply end after a positive response to INQUIRY 84.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention. For example, the present invention is not meant to be limited to imaging systems using ultra-violet light.

We claim:

1. Apparatus for providing light to a light-sensitive material at an imaging plane, comprising:

a photochromic filter activated by light of a first wavelength;

a first light source for activating said photochromic filter with light of said first wavelength; and a second light source for providing, at said imaging plane, light of a second wavelength different from said first wavelength passed through said activated photochromic filter to said light-sensitive material.

2. The apparatus of claim 1 wherein said photochromic filter darkens upon exposure to light of said first wavelength.

3. The apparatus of claim 1 wherein said photochromic filter lightens upon exposure to light of said first wavelength.

4. The apparatus of claim 1 wherein said first light source selectively activates said photochromic filter.

5. The apparatus of claim 1 wherein said first light source comprises a variable intensity light source.

6. The apparatus of claim 5 further comprising a detector situated in said imaging plane for measuring light intensity.

7. The apparatus of claim 6 further comprising a controller for controlling said variable intensity light source based on said measured light intensity.

8. Apparatus for exposing a light-sensitive material situated in an imaging plane, comprising:

a photochromic filter activated by light of a first wavelength;

a first light source for selectively activating said photochromic filter with light of said first wavelength; and a second light source for exposing said light-sensitive material with light of a second wavelength different from said first wavelength passed through said selectively activated photochromic filter.

9. The apparatus of claim 8, wherein said first light source comprises a plurality of light sources, each of said plurality of light sources having a variable intensity.

10. The apparatus of claim 8, wherein said first light source comprises a diffuser for varying light intensity.

11. The apparatus of claim 8, wherein said first light source comprises a variable intensity raster scanner.

12. The apparatus of claim 8 further comprising a detector situated in said imaging plane for measuring intensity distribution of said light of said second wavelength in selected portions of said imaging plane.

13. The apparatus of claim 12 further comprising a controller for controlling said first light source based on said measured intensity distribution.

14. The apparatus of claim 13 wherein said controller comprises a computer.

15. The apparatus of claim 12 wherein said detector comprises an array of charge coupled devices.

16. Apparatus for imaging features on a semiconductor wafer situated in an imaging plane coated with a light-sensitive material, comprising:

a photochromic filter activated by light of a first wavelength;

a first variable-intensity light source for selectively activating said photochromic filter with light of said first wavelength;

a second light source for exposing said light-sensitive material with light of a second wavelength different from said first wavelength passed through said photochromic filter;

a mask for imaging said features in said light-sensitive material;

a plurality of detectors temporarily situated in said imaging plane for measuring light intensity distribution in selected portions of said imaging plane; and a controller for controlling light intensity of said first variable-intensity light source based on said measured light intensity distribution.

17. The apparatus of claim 16, wherein said first variable-intensity light source comprises a plurality of variable-intensity light sources.

18. The apparatus of claim 16 further comprising a beam splitter for directing light from said first light source to said photochromic filter.

19. The apparatus of claim 18 wherein said beam splitter lies in a light path of said second light source.

20. The apparatus of claim 19 wherein said beam splitter reflects said light of said first wavelength and transmits said light of said second wavelength.

21. A method for exposing a light-sensitive material in an imaging plane, comprising steps of:

activating a photochromic filter with light of a first wavelength, said photochromic filter being situated in a light path for exposing said light-sensitive material; and exposing said light-sensitive material with light of a second wavelength different from said first wavelength passed through said activated photochromic filter.

22. The method of claim 21 wherein said step of activating comprises exposing said photochromic filter to varying intensity light of said first wavelength.

23. The method of claim 21 further comprising steps of:

measuring light intensity at said imaging plane; and altering intensity of said light of said first wavelength based on said measured light intensity.

24. The method of claim 23, wherein said photochromic filter darkens upon exposure to said light of said first wavelength and wherein said step of altering comprises:

reducing said intensity for a corresponding location on said photochromic filter if said measured light intensity is greater than a predetermined light intensity; and increasing said intensity for a corresponding location on said photochromic filter if said measured light intensity is less than said predetermined light intensity.

25. A method for exposing a light-sensitive material in an imaging plane, comprising steps of:

selectively activating a photochromic filter with light of a first wavelength situated in a light path for exposing said light-sensitive material; and exposing said light-sensitive material with light of a second wavelength different from said first wavelength passed through said selectively activated photochromic filter.

26. The method of claim 25 wherein said step of selectively activating comprises creating a blocking pattern in said photochromic filter.

27. The method of claim 25 wherein said step of selectively activating comprises exposing selected portions of said photochromic filter to varying intensity light of said first wavelength.

28. The method of claim 25 further comprising steps of:

measuring light intensity distribution in selected portions of said imaging plane; and altering intensity distribution of said light of said first wavelength based on said measured light intensity distribution.

29. The method of claim 28 wherein said step of measuring comprises sampling light intensity at a plurality of predetermined locations across said imaging plane.

30. The method of claim 29, wherein said photochromic filter darkens upon exposure to said light of said first wavelength and wherein said step of altering comprises:

determining for each of said plurality of predetermined locations, a variation of said sampled light intensity from an average light intensity for all of said plurality of predetermined locations;

reducing light intensity for a corresponding location on said photochromic filter if said measured light intensity at a given one of said plurality of predetermined locations is greater than said average light intensity; and increasing light intensity for a corresponding location on said photochromic filter if said measured light intensity at a given one of said plurality of predetermined locations is less than said average light intensity.

31. A method for imaging a uniform feature type on a semiconductor wafer coated with a light-sensitive material in an imaging plane, comprising steps of:

selectively activating a photochromic filter with variable intensity light of a first wavelength;

exposing said light-sensitive material with light of a second wavelength different from said first wavelength passed through said selectively activated photochromic filter;

measuring light intensity distribution across said imaging plane; and automatically altering intensity of said variable intensity light based on said measured light intensity distribution to maintain feature-type uniformity.

* * * * *